US007867331B2

(12) United States Patent
Kennedy et al.

(10) Patent No.: US 7,867,331 B2

(45) Date of Patent: Jan. 11, 2011

(54) COATING COMPOSITION OPTIMIZATION FOR VIA FILL AND PHOTOLITHOGRAPHY APPLICATIONS AND METHODS OF PREPARATION THEREOF

(75) Inventors: Joseph Kennedy, San Jose, CA (US); Jason Stuck, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 741 days.

(21) Appl. No.: 10/567,420

(22) PCT Filed: Aug. 4, 2004

(86) PCT No.: PCT/US2004/025231

§ 371 (c)(1), (2), (4) Date: Apr. 4, 2007

(87) PCT Pub. No.: WO2005/041255

PCT Pub. Date: May 6, 2005

(65) Prior Publication Data

US 2007/0272123 A1 Nov. 29, 2007

Related U.S. Application Data

(60) Provisional application No. 60/492,606, filed on Aug. 4, 2003.

(51) Int. Cl.
*C04B 41/50* (2006.01)

(52) U.S. Cl. .................... 106/287.1; 438/622; 438/637; 257/E21.262; 257/E21.273

(58) Field of Classification Search ............. 106/287.1; 438/622, 637; 257/E21.262, E21.273
See application file for complete search history.

(56) References Cited

U.S. PATENT DOCUMENTS

| | | | | |
|---|---|---|---|---|
| 3,884,702 | A | 5/1975 | Koshimo et al. | |
| 4,191,571 | A | 3/1980 | Nonogaki et al. | |
| 4,299,938 | A | 11/1981 | Green et al. | |
| 4,413,052 | A | 11/1983 | Green et al. | |
| 4,430,153 | A | 2/1984 | Gleason et al. | |
| 4,587,138 | A | 5/1986 | Yau et al. | |
| 4,863,827 | A | 9/1989 | Jain et al. | |
| 4,863,829 | A | 9/1989 | Furuta et al. | |
| 4,910,122 | A | 3/1990 | Arnold et al. | |
| 4,935,583 | A | 6/1990 | Kyle | |
| 4,943,511 | A | 7/1990 | Lazarus et al. | |
| 4,950,583 | A | 8/1990 | Brewer et al. | |
| 5,100,503 | A | 3/1992 | Allman et al. | |
| 5,126,289 | A | 6/1992 | Ziger | |
| 5,302,849 | A | 4/1994 | Cavasin | |
| 5,403,680 | A | 4/1995 | Otagawa et al. | |
| 5,674,648 | A | 10/1997 | Brewer et al. | |
| 5,759,625 | A | 6/1998 | Laubacher et al. | |
| 5,851,730 | A | 12/1998 | Thackeray et al. | |
| 5,851,738 | A | 12/1998 | Thackeray et al. | |
| 6,165,697 | A | 12/2000 | Thackeray et al. | |
| 6,365,529 | B1 * | 4/2002 | Hussein et al. | 438/780 |
| 6,399,269 | B2 | 6/2002 | Mizutani et al. | |
| 6,451,503 | B1 | 9/2002 | Thackeray et al. | |
| 6,472,128 | B2 | 10/2002 | Thackeray et al. | |
| 6,506,497 | B1 * | 1/2003 | Kennedy et al. | 428/447 |
| 6,528,235 | B2 | 3/2003 | Thackeray et al. | |
| 6,605,362 | B2 | 8/2003 | Baldwin et al. | |
| 6,858,528 | B2 * | 2/2005 | Meagley et al. | 438/629 |
| 7,014,982 | B2 | 3/2006 | Thackeray et al. | |
| 2006/0110682 | A1 | 5/2006 | Thackeray et al. | |
| 2006/0155594 | A1 | 7/2006 | Almeida et al. | |

FOREIGN PATENT DOCUMENTS

| | | |
|---|---|---|
| WO | 03/044078 A | 5/2003 |

OTHER PUBLICATIONS

Brewer, T. et al., "The Reduction of the Standing Wave Effect in Positive Photoresists," Jour. Appl. Photogr. Eng., vol. 7, No. 6, 184-186 (Dec. 1981).

Crivello et al., J. Polym. Sci.: Polym. Chem. 21 (1983), 97-109.

Degussa, "Silanes for Adhesives and Sealants," 18-19, available at www.dynasylan.com.

Lamola, A. et al., "Chemically Amplified Resists," Solid State Technology, 53-60 (Aug. 1991).

Y.-C. Lin et al., "Some Aspects of Anti-Reflective Coating for Optical Lithography," Advances in Resist Technology and Processing, Proc., SPIE vol. 469, 30-37 (1984).

(Continued)

*Primary Examiner*—Walter L Lindsay, Jr.
*Assistant Examiner*—Stanetta D Isaac
(74) *Attorney, Agent, or Firm*—Sandra P. Thompson; Buchalter Nemer

(57) ABSTRACT

A sacrificial coating material includes: at least one inorganic compound, and at least one material modification agent, wherein the sacrificial coating material is dissolvable in an alkaline-based chemistry or a fluorine-based chemistry. A method of producing a sacrificial coating material includes: providing at least one inorganic compound, providing at least one material modification agent, combining the at least one inorganic compound with the at least one material modification agent to form the sacrificial coating material, wherein the sacrificial coating material is dissolvable in an alkaline-based chemistry or a fluorine-based chemistry, but not organic casting solvents commonly used in organic BARC materials.

32 Claims, No Drawings

OTHER PUBLICATIONS

McKean et al., "Characterization of a Novolac-Based Three-Component Deep-UV Resist," Chem. Mater. (1990) 2, 619-624.

Nalamasu et al., "Development of a Chemically Amplified Positive (CAMP) Resist Material for Single Layer Deep-UV Lithography," Advances in Resist Technology and Processing VII, SPIE 1262, 32-41 (1990).

Silverstein et al., "Spectrometric Identification of Organic Compounds," 4th Ed. John Wiley & Sons 1991, 309-311.

Willson, C.G., "Organic Resist Materials—Theory and Chemistry," Introduction to Microlithography, American Chemical Society, 87-159 (1983).

Hawley's Condensed Chemical Dictionary, 11th ed., 85-86.

"HD Micro Puts Out Positive Polyamide," Electronic News, Jun. 19, 2000.

Jaskot et al., Toxicological Sciences, 22(1): 103-112 (1994).

Yusuke Izumi et al., "Hydrosilyation of Carbonyl Compounds Catalyzed by Solid Acids and Bases," Tetrahedron Letters, vol. 32, No. 36, pp. 4744 (1991).

90008360, Shipley Company, L.L.C.

* cited by examiner

COATING COMPOSITION OPTIMIZATION FOR VIA FILL AND PHOTOLITHOGRAPHY APPLICATIONS AND METHODS OF PREPARATION THEREOF

This application is a national phase application of application Ser. No. PCT/US2004/25231, filed Aug. 4, 2004, which claims priority to Ser. No. 60/492,606 filed Aug. 4, 2003 which are incorporated herein by reference in its entirety.

BACKGROUND

To meet the requirements for faster performance, the characteristic dimensions of features of integrated circuit devices have continued to be decreased. Manufacturing of devices with smaller feature sizes introduces new challenges in many of the processes conventionally used in semiconductor fabrication. One of the most important of these fabrication processes is photolithography.

Via first trench last (VFTL) copper dual damascene patterning through an low dielectric constant (less than about 3) material or ultra low dielectric constant (less than about 2) material can be very difficult. One of the problems with this type of patterning is the selective removal of the sacrificial fill material from the low dielectric constant materials. Previous work has shown that Si—O fill materials (either UV absorbing or transparent) are the optimum materials platform, if the dielectric layer is Si—O based.

In order to improve the removal selectivity of the sacrificial fill material it must be chemically weakened relative to the dielectric material. A porogen or a high boiling solvent can be added to the fill material to weaken it; however, in order to achieve photoresist developer resistance the Si—O based fill material either needs to be baked to or at a sufficiently high temperature to ensure crosslinking or the porogen content needs to be lowered. Both of these methods designed to achieve photoresist developer resistance work with respect to strengthening the fill material, but the removal selectivity of the fill material is significantly decreased.

Therefore, a desirable coating material is one that a) would be impervious to photoresist developers and methods of production of the coating materials described; b) can satisfy any goals of increasing etch selectivity and/or stripping selectivity; c) is compatible with anti-reflective and/or absorbing layers (BARC—"bottom antireflective coating"), such as organic absorbing compositions and layers, and also low k ILD's; and/or d) can satisfy any goals of minimizing fill bias and voiding in via structures would be desirable to advance the production of layered materials, electronic components and semiconductor components.

SUMMARY OF THE INVENTION

A sacrificial coating material includes: at least one inorganic compound, and at least one material modification agent, wherein the sacrificial coating material is dissolvable in an alkaline-based chemistry or a fluorine-based chemistry.

A method of producing a sacrificial coating material includes: providing at least one inorganic compound, providing at least one material modification agent, combining the at least one inorganic compound with the at least one material modification agent to form the sacrificial coating material, wherein the sacrificial coating material is dissolvable in an alkaline-based chemistry or a fluorine-based chemistry.

DETAILED DESCRIPTION

As mentioned, VFTL copper dual damascene patterning through ultra low k dielectrics (dielectric constant less than about 3) is very difficult. The main problem is the selective removal of the sacrificial fill material from these low k dielectric materials. Previous work has shown that Si—O fill material (either UV absorbing or transparent fill material) is the optimum material platform if the dielectric layer is Si—O based. In response to this information, a sacrificial coating material has been designed and is contemplated herein that comprises at least one inorganic compound and/or material and at least one material modification agent. This sacrificial coating material can be used to form a transparent via fill layer when applied to a surface, such as a dielectric layer. To improve the removal selectivity of the sacrificial coating material, the coating material is made chemically weaker through the addition of the at least one material modification agent, such as those described herein. The at least one material modification agent may include any compound or composition that can modify the sacrificial coating material to improve the photolithographic, compatibility and/or physical quality of the resulting film or layered material, such as by improving the etch selectivity and/or stripping selectivity or by minimizing the fill bias. The at least one material modification agent may comprise at least one porogen, at least one adhesion promoter, at least one densifying agent, at least one leveling agent, at least one high-boiling solvent, at least one catalyst, at least one pH tuning agent, at least one capping agent and/or at least one replacement solvent.

The coating material, however, also needs to be balanced so that its compatible with an absorbing composition, such as a separate BARC layer or layers, and at the same time needs to have a highly selective strip rate to the low k and ultra-low k dielectric materials, coatings and/or films. To solve this problem the photoresist can be patterned directly on an absorbing composition layer previously applied on top of the chemically weak Si—O based fill material. Surprisingly, resistance can be maintained to non-aqueous solvents (in this case PGMEA) while at the same time allowing for complete removal by a standard photoresist developer (2.5% TMAH in water or other aqueous-based amine or fluorine-based chemistries) system. Such a contrast in chemical resistance means that, in some embodiments, an organic absorbing composition layer can be coated onto an extremely weak Si—O film. Photoresist patterning would then occur on the absorbing composition layer, such as an organic absorbing composition layer, and not on the Si—O layer. Since the Si—O can be rapidly removed in mild 2.5% TMAH solutions, it can also be rapidly removed in other fluoride and more aggressive alkaline chemistries. Such an increase in strip rate provides the selectivity to low k and ultra low k films that is needed.

Inorganic-Based Materials and Inorganic Compounds

Inorganic-based compounds and/or materials and/or contemplated spin-on inorganic-based compounds and/or materials, such as silicon-based, gallium-based, germanium-based, arsenic-based, boron-based compounds or combinations thereof are contemplated herein. Examples of silicon-based compounds comprise siloxane compounds, such as methylsiloxane, methylsilsesquioxane, phenylsiloxane, phenylsilsesquioxane, methylphenylsiloxane, methylphenylsilsesquioxane, silazane polymers, dimethylsiloxane, diphenylsiloxane, methylphenylsiloxane, silicate polymers, silsilic acid derivatives, and mixtures thereof. A contemplated silazane polymer is perhydrosilazane, which has a "transparent" polymer backbone. Contemplated compounds and materials are those that are "non-UV absorbing" compounds.

As used herein, inorganic-based materials, inorganic compounds and spin-on-glass materials also include siloxane polymers and blockpolymers, hydrogensiloxane polymers of the general formula $(H_{0-1.0}SiO_{1.5-2.0})_x$, hydrogensilsesquioxane polymers, which have the formula $(HSiO_{1.5})_x$, where x is greater than about four and derivatives of silsilic acid and combinations thereof. Also included are copolymers of hydrogensilsesquioxane and an alcoxyhydridosiloxane or hydroxyhydridosiloxane. Materials contemplated herein additionally include organosiloxane polymers, acrylic siloxane polymers, silsesquioxane-based polymers, derivatives of silici acid, organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than zero and the sum of n and m is greater than about four and R is alkyl or aryl, and combinations thereof. Some useful organohydridosiloxane polymers have the sum of n and m from about four to about 5000 where R is a $C_1$-$C_{20}$ alkyl group or a $C_6$-$C_{12}$ aryl group. The organohydridosiloxane and organohydridosilsesquioxane polymers are alternatively denoted spin-on-polymers. Some specific examples include alkylhydridosiloxanes, such as methylhydridosiloxanes, ethylhydridosiloxanes, propylhydridosiloxanes, t-butylhydridosiloxanes, phenylhydridosiloxanes; and alkylhydridosilsesquioxanes, such as methylhydridosilsesquioxanes, ethylhydridosilsesquioxanes, propylhydridosilsesquioxanes, t-butylhydridosilsesquioxanes, phenylhydridosilsesquioxanes, and combinations thereof.

As used herein, the phrases "spin-on material", "spin-on composition" and "spin-on inorganic composition" may be used interchangeable and refer to those solutions and compositions that can be spun-on to a substrate or surface. It is further contemplated that the phrase "spin-on-glass materials" refers to a subset of "spin-on inorganic materials", in that spin-on glass materials refer to those spin-on materials that comprise silicon-based compounds and/or polymers in whole or in part.

In some contemplated embodiments, specific organohydridosiloxane resins utilized herein have the following general formulas:

$$[H—Si_{1.5}]_n[R—SiO_{1.5}]_m \quad \text{Formula (1)}$$

$$[H_{0.5}—Si_{1.5-1.8}]_n[R_{0.5-1.0}—SiO_{1.5-1.8}]_m \quad \text{Formula (2)}$$

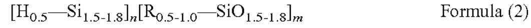

$$[H_{0-1.0}—Si_{1.5}]_n[R—SiO_{1.5}]_m \quad \text{Formula (3)}$$

$$[H—Si_{1.5}]_x[R—SiO_{1.5}]_y[SiO_2]_z \quad \text{Formula (4)}$$

wherein:

the sum of n and m, or the sum or x, y and z is from about 8 to about 5000, and m or y is selected such that carbon containing constituents are present in either an amount of less than about 40 percent (Low Organic Content=LOSP) or in an amount greater than about 40 percent (High Organic Content=HOSP); R is selected from substituted and unsubstituted, normal and branched alkyls (methyl, ethyl, butyl, propyl, pentyl), alkenyl groups (vinyl, allyl, isopropenyl), cycloallyls, cycloalkenyl groups, aryls (phenyl groups, benzyl groups, naphthalenyl groups, anthracenyl groups and phenanthrenyl groups), and mixtures thereof; and wherein the specific mole percent of carbon containing substituents is a function of the ratio of the amounts of starting materials. In some LOSP embodiments, particularly favorable results are obtained with the mole percent of carbon containing substituents being in the range of between about 15 mole percent to about 25 mole percent. In some HOSP embodiments, favorable results are obtained with the mole percent of carbon containing substituents are in the range of between about 55 mole percent to about 75 mole percent.

Several contemplated polymers comprise a polymer backbone encompassing alternate silicon and oxygen atoms. In contrast with previously known organosiloxane resins, some of the polymers and inorganic-based compositions and materials utilized herein have essentially no hydroxyl or alkoxy groups bonded to backbone silicon atoms. Rather, each silicon atom, in addition to the aforementioned backbone oxygen atoms, is bonded only to hydrogen atoms and/or R groups as defined in Formulae 1, 2, 3 and 4. By attaching only hydrogen and/or R groups directly to backbone silicon atoms in the polymer, unwanted chain lengthening and cross-linking is avoided. And given, among other things, that unwanted chain lengthening and cross-linking is avoided in the resins of the present invention, the shelf life of these resin solutions is enhanced as compared to previously known organosiloxane resins. Furthermore, since silicon-carbon bonds are less reactive than silicon hydrogen bonds, the shelf life of the organohydridosiloxane resin solutions described herein is enhanced as compared to previously known hydridosiloxane resins.

Some of the contemplated compounds and methods of producing those compounds previously mentioned are taught by commonly assigned U.S. Pat. No. 6,143,855 and pending U.S. Ser. No. 10/078,919 filed Feb. 19, 2002; Honeywell International Inc.'s commercially available HOSP® product; nanoporous silica such as taught by commonly assigned U.S. Pat. No. 6,372,666; Honeywell International Inc.'s commercially available NANOGLASS®E product; organosilsesquioxanes taught by commonly assigned WO 01/29052; and fluorosilsesquioxanes taught by commonly assigned U.S. Pat. No. 6,440,550, incorporated herein in their entirety. Other contemplated compounds are described in the following issued patents and pending applications, which are herein incorporated by reference in their entirety: (PCT/US00/15772 filed Jun. 8, 2000; U.S. application Ser. No. 09/330,248 filed Jun. 10, 1999; U.S. application Ser. No. 09/491,166 filed Jun. 10, 1999; U.S. Pat. No. 6,365,765 issued on Apr. 2, 2002; U.S. Pat. No. 6,268,457 issued on Jul. 31, 2001; U.S. application Ser. No. 10/001,143 filed Nov. 10, 2001; U.S. application Ser. No. 09/491,166 filed Jan. 26, 2000; PCT/US00/00523 filed Jan. 7, 1999; U.S. Pat. No. 6,177,199 issued Jan. 23, 2001; U.S. Pat. No. 6,358,559 issued Mar. 19, 2002; U.S. Pat. No. 6,218,020 issued Apr. 17, 2001; U.S. Pat. No. 6,361,820 issued Mar. 26, 2002; U.S. Pat. No. 6,218,497 issued Apr. 17, 2001; U.S. Pat. No. 6,359,099 issued Mar. 19, 2002; U.S. Pat. No. 6,143,855 issued Nov. 7, 2000; U.S. application Ser. No. 09/611,528 filed Mar. 20, 1998; and U.S. Application Ser. No. 60/043,261). Silica compounds contemplated herein are those compounds found in US Issued Patents: U.S. Pat. Nos. 6,022,812; 6,037,275; 6,042,994; 6,048,804; 6,090,448; 6,126,733; 6,140,254; 6,204,202; 6,208,041; 6,318,124 and 6,319,855.

As used herein, the term "crosslinking" refers to a process in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules.

In some contemplated embodiments, the polymer backbone conformation is a cage configuration. Accordingly, there are only very low levels or reactive terminal moieties in the polymer resin given the cage conformation. A cage conformation of the polymer backbone also ensures that no unwanted chain lengthening polymerization will occur in solution, resulting in an extended shelf life. Each silicon atom of the polymer is bonded to at least three oxygen atoms. Moieties bonded to the polymer backbone include hydrogen and the organic groups described herein. As used herein, the term "backbone" refers to a contiguous chain of atoms or moieties forming a polymeric strand that are covalently bound such that removal of any of the atoms or moiety would result in interruption of the chain.

As used herein, the term "monomer" refers to any chemical compound that is capable of forming a covalent bond with itself or a chemically different compound in a repetitive manner. The repetitive bond formation between monomers may lead to a linear, branched, super-branched, or three-dimensional product. Furthermore, monomers may themselves comprise repetitive building blocks, and when polymerized the polymers formed from such monomers are then termed "blockpolymers". Monomers may belong to various chemical classes of molecules including organic, organometallic or inorganic molecules. The molecular weight of monomers may vary greatly between about 40 Dalton and 20000 Dalton. However, especially when monomers comprise repetitive building blocks, monomers may have even higher molecular weights. Monomers may also include additional groups, such as groups used for crosslinking.

In some contemplated embodiments, the molecular weight of the inorganic-based compound may be altered in order to change the solubility of the material. In turn, changing the solubility of the material may help prevent voiding, may increase the planarization ability of the material, and may reduce the defect level.

Porogens

At least one porogen may be added to the inorganic-based composition or inorganic material in order to increase etch selectivity and/or stripping selectivity of the inorganic-based material or composition. Without being bound to any particular theory, it is understood that in one aspect of the subject matter herein the addition of at least one porogen to the inorganic-based material will result in pores or voids being formed in the material, coating and/or film. The pores or voids may be formed as a result of structural rearrangement or loss of material such that a pore or void or increase in free volume is left behind. The pores or voids in the material, coating and/or film create additional surface area in the coating or film which ultimately increases the etch selectivity and/or stripping selectivity of the material, coating and/or film. The porosity of the fill material, generally, is about the same as the porosity of the low k dielectric material, and in both instances, the porosity is greater than the porosity of the photoresist material. These dry etch selectivities are necessary to maintain proper transfer of the critical dimension from photoresist patterning through etch. The porogen's molecular weight can also be used to determine if the porogen is compatible with the inorganic-based compound's matrix in the material. This compatibility quotient is related to the solubility parameters of the inorganic-based compound's matrix. In an ideal case the porogen should match the solubility parameter of the matrix coating formulation before bake, so that when formulation molecular weights are known, appropriate molecular weights of the porogen can be determined by matching the solubility parameters with the matrix. Solubility parameters may be determined experimentally by relationships to the film defects, dielectric constant, wet etching tests, defect inspection through microscopes or scanning electron microscopy, or by calculation using group contribution methods or by molecular models of cohesive energy. (Please see: Physical Properties of Polymers Handbook, Chapter 16 "Solubility Parameters" Y. Du, Y. Xue, H. L. Frisch pp 227-239; James E. Mark Ed., 1996, American Institute of Physics, Woodbury, N.Y.)

In another aspect of the subject matter taught herein, the porogen may serve a dual purpose or multi-stage purpose. The porogen may be specifically chosen for a particular inorganic composition based on polarity and/or functional groups. Once the porogen is incorporated into the composition, either pre-bake or post-bake, it will act effectively as a "magnet" to attract the stripping and/or etching solution to the porogen by utilizing a difference in polarity between the porogen or by utilizing the functional groups on the porogen. This attraction effect by the porogen can be activated in several ways. For example, there may be an exothermic reaction that takes place when the porogen is incorporated into the inorganic composition at room temperature, there may be an external energy and/or heat that needs to be added to "activate" the porogen or there may be a pressure differential applied to the inorganic composition that will "activate" the porogen. However, whether energy is added or not once the porogen is added, it should be understood that, in this embodiment, the porogen can be activated to the point where a complete pore or void is formed and the porogen remains until the lithography step is completed. Once the lithography step is completed, the inorganic composition comprising the porogen may be further heated so that the porogen can form a pore or void. At this point, the pores or voids in the material, coating and/or film create additional surface area in the coating or film which ultimately increases the etch selectivity and/or stripping selectivity of the material, coating and/or film, as described in the earlier embodiments. It should also be understood that the porogen may be added merely for its chemical properties without ever intending to create pores in the material. In some embodiments, it is contemplated that the porogen is easily dissolved by the wet etchant and then creates conduits into the film for faster etching of the remaining film.

As used herein, the term "pore" includes voids and cells in a material and any other term meaning space occupied by gas in the material. The term "pore" may also include a differential in material density wherein the free volume has been increased ("porous nature" has been introduced). Appropriate gases include relatively pure gases and mixtures thereof. Air, which is predominantly a mixture of $N_2$ and $O_2$ is commonly distributed in the pores, but pure gases such as nitrogen, helium, argon, $CO_2$ or CO are also contemplated. Pores are typically spherical but may alternatively or additionally include tubular, lamellar, discoidal, voids having other shapes, or a combination of the preceding shapes and may be open or closed. The term "porogen" as used herein may have a variety of mechanisms available to form the pore but in general is a material which upon removal leaves behind either a "pore" or a "void" or a material that can rearrange to create a "pore" or "void". In one embodiment, a porogen is a decomposable material that is radiation, thermally, chemically or moisture decomposable, degradable, depolymerizable or otherwise capable of breaking down and includes solid, liquid or gaseous material.

The decomposed porogen is removable from or can volatilize or diffuse through a partially or fully cross-linked matrix to create pores in a subsequently fully-cured matrix and thus, lower the matrix's dielectric constant and enhance the sacrificial properties. In another embodiment, the porogen might be a material, which does not decompose but can be dissolved out of the matrix leaving behind the "pore". In a third embodiment the porogen might be a material that does not decompose but is volatile enough to dissipate at specific elevated temperatures such as in the 250-350° C. range. Supercritical materials, such as $CO_2$, may be used to remove the porogen and decomposed porogen fragments. Preferably, for a thermally decomposable porogen, the porogen comprises a material having a decomposition temperature greater than the minimum crosslinking temperature of the material. Preferably, the present novel porogens have a degradation or decomposition temperature of up to about 300° C., and in some cases greater than about 300° C. Preferably, the degraded or decomposed porogens volatilize at a temperature greater than the minimum cross-linking temperature of the material with which the porogen is combined. Preferably, the degraded or decomposed porogens volatilize at a temperature between about 50° to about 450° C.

Known porogens, such as linear polymer, star polymers, cross-linked polymeric nanospheres, block copolymers, and hyperbranched polymers may be used in contemplated embodiments with the inorganic-based compounds and materials. Suitable linear polymers are polyethers, such as poly (ethylene oxide) and poly(propylene oxide); polyacrylates such as poly(methylmethacrylate); aliphatic polycarbonates such as poly(propylene carbonate) and poly(ethylene carbonate); polyesters; polysulfones; polystyrene (including monomer units selected from halogenated styrene and hydroxy-substituted styrene); poly(α-methylstyrene); and other vinyl-based polymers. Useful polyester porogens include polycaprolactone; polyethylene terephthalate; poly(oxyadipoyloxy-1,4-phenylene); poly(oxyterephthaloyloxy-1,4-phenylene); poly(oxyadipoyloxy-1,6-hexamethylene); polyglycolide, polylactide (polylactic acid), polylactide-glycolide, polypyruvic acid, polycarbonate such as poly(hexamethylene carbonate) diol having a molecular weight from about 500 to about 2500; and polyether such as poly(bisphenol A-co-epichlorohydrin) having a molecular weight from about 300 to about 6500. Suitable crosslinked, insoluble nanospheres (prepared as nanoemulsions) are suitably comprised of polystyrene or poly(methylmethacrylate). Suitable block copolymers are poly-gylcolids, polylactic acid, poly (styrene-co-α-methylstyrene, poly(styrene-ethylene oxide), poly(etherlactones), poly(estercarbonates) and poly(lactonelactide). Suitable hyperbranched polymers are hyperbranched polyester, e.g. hyperbranched poly(caprolactone), and polyethers such as polyethylene oxide and polypropylene oxide. Another useful porogen is ethylene glycol-poly(caprolactone). Useful polymer blocks include polyvinylpyridines, hydrogenated polyvinyl aromatics, polyacrylonitriles, polysiloxanes, polycaprolactams, polyurethanes, polydienes such as polybutadienes and polyisoprenes, polyvinyl chlorides, polyacetals and amine-capped alkylene oxides. Other useful thermoplastic materials include polyisoprenes, polytetrahydrofurans and polyethyloxazolines.

Other suitable porogens suitable for use in contemplated embodiments include polymers, preferably those which contain one or more reactive groups, such as hydroxyl or amino. Within these general parameters, a suitable polymer porogen for use in the compositions and methods disclosed herein is, e.g. a polyalkylene oxide, a monoether of a polyalkylene oxide, a diether of a polyalkylene oxide, bisether of a polyalkylene oxide, an aliphatic polyester, an acrylic polymer, an acetal polymer, a poly(caprolactone), a poly(valeractone), a poly(methlymethoacrylate), a poly(vinylbutyral) and/or combinations thereof. When the porogen is a polyalkylene oxide monoether, one particular embodiment is a $C_1$ to about $C_6$ alkyl chain between oxygen atoms and a $C_1$ to about $C_6$ alkyl ether moiety, and wherein the alkyl chain is substituted or unsubstituted, e.g., polyethylene glycol monomethyl ether, polyethylene glycol dimethyl ether, or polypropylene glycol monomethyl ether.

Porogens comprising at least two fused aromatic rings wherein each of the fused aromatic rings has at least one alkyl substituent thereon and a bond exists between at least two of the allyl substituents on adjacent aromatic rings may be used in contemplated embodiments. Preferred porogens include unfunctionalized polyacenaphthylene homopolymer, functionalized polyacenaphthylene homopolymer, the polyacenaphthylene copolymers described below, poly(2-vinylnaphthalene) and vinyl anthracene, and blends with each other. Other useful porogens include adamantane, diamantane, fullerene and polynorbornene. Each of these porogens, including those listed above, may be blended with one another or other porogen material, such as polycaprolactone, polystyrene and polyester. Useful blends include unfunctionalized polyacenaphthylene homopolymer and polycaprolactone. The more preferred porogens are unfunctionalized polyacenaphthylene homopolymer, functionalized polyacenaphthylene homopolymer, polyacenaphthylene copolymer and polynorbornene.

Useful polyacenaphthylene homopolymers may have weight average molecular weights ranging from preferably about 300 to about 20,000; more preferably about 300 to about 10,000; and most preferably about 1000 to about 7000 and may be polymerized from acenaphthylene using different initiators such as 2,2'-azobisisobutyronitrile (AIBN); di-tert-butyl azodicarboxylate; di-phenylazodicarboxylate; 1,1'-azobis(cyclohezanecarbonitrile); benzoyl peroxide (BPO); t-butyl peroxide; and boron trifluoride diethyl etherate. The polyacenaphthylene homopolymer may have functional end groups such as triple bonds or double bonds to the chain end or cationic polymerization quenched with a double or triple bond alcohol, such as allyl alcohol, propargyl alcohol, butynol, butenol or hydroxyethylmethacrylate.

Useful polyacenaphthylene copolymers may be linear polymers, star polymers or hyperbranched polymers. The comonomer may have a bulky side group that will result in copolymer conformation that is similar to that of polyacenaphthylene homopolymer or a nonbulky side group that will result in copolymer conformation that is dissimilar to that of polyacenaphthylene homopolymer. Comonomers having a bulky side group include vinyl pivalate; tert-butyl acrylate; styrene; α-methylstyrene; tert-butylstyrene; 2-vinylnaphthalene; 5-vinyl-2-norbornene; vinyl cyclohexane; vinyl cyclopentant; 9-vinylanthracene; 4-vinylbiphenyl; tetraphenylbutadiene; stilbene; tert-butylstilbene; and indene; and preferably vinyl pivalate. Hydridopolycarbosilane may be used as an additional co-monomer or copolymer component with acenaphthylene and at least one of the preceding comonomers. An example of a useful hydridopolycarbosilane has 10% or 75% allyl groups. Comonomers having a nonbulky side group include vinyl acetate, methyl acrylate, methyl methacrylate, and vinyl ether and preferably vinyl acetate.

When discussing pore generation, the term "degrade" refers to the breaking of covalent bonds. Such breaking of bonds may occur in numerous ways including heterolytic and homolytic breakage. The breaking of bonds need not be complete, i.e., not all breakable bonds must be cleaved. Furthermore, the breaking of bonds may occur in some bonds faster than in others. Ester bonds, for example, are generally less stable than amide bonds, and therefore, are cleaved at a faster rate. Breakage of bonds may also result in the release of fragments differing from one another, depending on the chemical composition of the degraded portion.

In a preferred embodiment of the pore generation process, for thermally degradable porogens, thermal energy is applied to the porogen containing material to substantially degrade or decompose the porogen into its starting components or monomers. As used herein, "substantially degrade" preferably means at least about 40 weight percent of the porogen degrades or decomposes. In more preferred embodiments, at least about 50 weight percent of the porogen degrades or decomposes, and in most preferred embodiments, at least about 80 weight percent of the porogen degrades or decomposes. In another embodiment, the porogen is dissolved out in either a separate process stage or in combination with other stages of process, such as during the photolithography development or during the actual wet stripping of the porogen containing material.

For the preferred embodiment, thermal energy is also applied to volatilize the substantially degraded or decomposed porogen out of the inorganic compound matrix. Preferably, the same thermal energy is used for both the degradation and volatilization steps. As the amount of volatilized degraded porogen increases, the resulting porosity of the material, coating and/or film increases.

Any suitable procedure or condition may be used to remove or at least partially remove the at least one porogen, including heat, dissolution in solvents, preferential etching, exposure to radiation, electromagnetic radiation, such as ultraviolet, x-ray, laser or infrared radiation; mechanical energy, such as sonication or physical pressure; or particle radiation, such as gamma ray, alpha particles, neutron beam or electron beam as taught by commonly assigned patent publication PCT/US96/08678 and U.S. Pat. Nos. 6,042,994; 6,080,526; 6,177,143; and 6,235,353, which are incorporated herein by reference in their entireties.

Adhesion Promoters

In some contemplated embodiments, the at least one adhesion promoter comprises at least one of the following characteristics: a) is thermally stable after heat treatment, such as baking, at temperatures generally used for electronic and semiconductor component manufacture; b) has a relatively low catalytic ability, in that the donor does not initiate significant crosslinking activity in the composition to which it is added; c) is relatively neutral; d) does not initiate or propagate reactions that increase the molecular weight of species in the composition to which it is added; e) can surprisingly act as an adhesion promoter by promoting electrostatic and coulombic interactions between layers of materials, as opposed to conventionally understood Van derWaals interactions.

Adhesion to an organic absorbing composition is inherently difficult because such compositions are designed with low polarity and few functional groups with which to interact adhesively. The adhesion mechanisms of silica-based formulations specifically to these organic absorbing compositions follows one of two pathways: a) adhesion promotion due to reduction in silanol content and increase in Van der Waals interactions and b) adhesion promotion due to an increase in the ionic contributions such as electrostatic and coulombic interaction.

Surprisingly, it has been found that the latter mechanism is dominant, although both play a role. In a contemplated embodiment, the addition of at least one adhesion promoter, such as at least one weak acid/weak base, at least one weak acid/strong base, at least one strong acid/strong base, at least one strong acid/weak base, at least one amine base, at least one amine salt or a combination thereof increases the electrostatic and coulombic interaction. This adhesion enhancement is demonstrated in the successful use of higher pH amine formulations (for example pH 5.5 formulations) where an APTEOS nitrate salt has been formed. This mechanism can also be found when using other amine salts such as: APTEOS acetate, APTEOS sulfonate, APTEOS methanesulfonate, APTEOS triflate, APTEOS tosylate, APTEOS nonafluorobutane-1-sulfonate (nfbs), tetramethylammonium hydroxide, tetramethylammonium acetate, tetramethylammonium nitrate, tetramethylammonium sulfate, tetramethylammonium methanesulfonate, tetramethylammonium triflate, tetramethylammonium tosylate, tetramethylammonium nfbs, tetramethylammonium triflate, ammonium nitrate, ammonium acetate, ammonium triflate, ammonium tosylate, ammonium sulfonate, ammonium methanesulfonate, or any other amine salt or combination of amine salts. Suitable amine bases comprise ammonium, pyridine, aniline, TMAH, CTAH, TBAH, APTEOS or a combination thereof. Detailed experiments utilizing these adhesion promoters are disclosed in U.S. patent application Ser. No. 10/717,028 filed on Nov. 18, 2003, which is commonly owned by Honeywell International Inc. and which are incorporated herein in its entirety.

The phrase "adhesion promoter" as used herein means any component that when used with a target composition, improves the adhesion of the target composition to substrates, surfaces and/or other layers as compared to using the target composition alone. Preferably the at least one adhesion promoter is used with the coating material or composition described herein, wherein the at least one adhesion promoter acts as a material modification agent. The target composition may comprise any composition that can be or is applied to a substrate, surface, layered surface, electronic or semiconductor component, including an absorbing composition, a coating material and/or a thermally degradable polymer. The adhesion promoter may be a co-monomer reacted with a thermally degradable polymer precursor or an additive to a thermally degradable polymer precursor. Examples of several useful adhesion promoters are disclosed in commonly assigned pending U.S. application Ser. No. 10/158,513 filed May 30, 2002 incorporated herein in its entirety.

Modeling indicates that salt mixture can be used with the same effectiveness as a single component. These mixed salt adhesion promotion schemes can be used when an increase in organic amine is required for solvent compatibility. In this case, a larger R group on the substituted ammonium center may be used, but the loss in adhesion can be compensated by addition of a more charged center such as ammonium.

As mentioned, a contemplated adhesion promoter may comprise nitrogen, phosphorus or any other similarly characterized atom. Contemplated adhesion promoters may comprise a neutral or acidic compound or molecule, such as amines salts, methylammonium nitrate, tetramethylammonium acetate (TMAA), tetrabutylammonium acetate (TBAA), cetyltrimethylammonium acetate (CTAA), and tetramethylammonium nitrate (TMAN). TMAN can be obtained by either dissolving TMAN in water or by converting TMAA or TMAH to TMAN by using nitric acid. Contemplated salts comprise those salts from strong acids and primary, secondary, tertiary or tetraamines.

In some embodiments, the ratio of "mole of nitrogen/Si-compound weight (ppm)" in nitrogen containing sacrificial coating materials and/or coating materials is greater than about 0.01. In other embodiments, the ratio of "mole of nitrogen/Si-compound weight (ppm)" in nitrogen containing sacrificial coating materials is greater than about 3. In yet other embodiments, the ratio of "mole of nitrogen/Si-compound weight (ppm)" in nitrogen containing sacrificial coating materials is greater than about 4. The optimum ratio depends on an evaluation of several properties by the skilled artisan of the coating material/composition, such as the amount of organic moiety present in the material, the degree of crosslinking present in the material and the pH of the material; however, it should be understood that the ratio influences the lithography properties and via fill properties moreso than any other previously mentioned material property with respect to nitrogen-containing compositions. It should also be understood that depending on the amount of organic moiety present, the degree of crosslinking present and/or the pH of the material, a suitable mole/weight ratio can be recognized and used to produce the sacrificial coating materials contemplated herein.

Adhesion promoters contemplated herein may also comprise compounds having at least bifunctionality wherein the bifunctionality may be the same or different and at least one of the first functionality and the second functionality is selected from the group consisting of Si-containing groups; N-containing groups; C bonded to O-containing groups; hydroxyl groups; and C double bonded to C-containing groups. The phrase "compound having at least bifunctionality" as used herein means any compound having at least two functional groups capable of interacting or reacting, or forming bonds as follows. The functional groups may react in numerous ways including addition reactions, nucleophilic and electrophilic substitutions or eliminations, radical reactions, etc. Further alternative reactions may also include the formation of non-covalent bonds, such as Van der Waals, electrostatic bonds, ionic bonds, and hydrogen bonds.

In some embodiments of the at least one adhesion promoter, preferably at least one of the first functionality and the second functionality is selected from Si-containing groups; N-containing groups; C bonded to O-containing groups; hydroxyl groups; and C double bonded to C-containing groups. Preferably, the Si-containing groups are selected from Si—H, Si—O, and Si—N; the N-containing groups are selected from such as $C—NH_2$ or other secondary and tertiary amines, imines, amides, and imides; the C bonded to O-containing groups are selected from ═CO, carbonyl groups such as ketones and aldehydes, esters, —COOH, alkoxyls having 1 to 5 carbon atoms, ethers, glycidyl ethers; and epoxies; the hydroxyl group is phenol; and the C double bonded to C-containing groups are selected from allyl and vinyl groups. For semiconductor applications, the more preferred functional groups include the Si-containing groups; C bonded to O-containing groups; hydroxyl groups; and vinyl groups.

Contemplated adhesion promoters may also comprise an organic resin-based material that further comprises phenolic-containing resins, novolac resins, such as CRJ-406 or HRJ-11040 (both from Schenectady International, Inc.), organic acrylate and/or a styrene resins. Other adhesion promoters may comprise polydimethylsiloxane materials, ethoxy or hydroxy-containing silane monomers, vinyl-containing silane monomers, acrylated silane monomers, or silyl hydrides.

An example of a contemplated adhesion promoter having Si-containing groups is silanes of the Formula I: $(R_{14})_k(R_{15})_lSi(R_{16})_m(R_{17})_n$, wherein $R_{14}$, $R_{15}$, $R_{16}$, and $R_{17}$ each independently represents hydrogen, hydroxyl, unsaturated or saturated alkyl, substituted or unsubstituted allyl where the substituent is amino or epoxy, saturated or unsaturated alkoxyl, unsaturated or saturated carboxylic acid radical, or aryl; at least two of $R_{14}$, $R_{15}$, $R_{16}$, and $R_{17}$ represent hydrogen, hydroxyl, saturated or unsaturated alkoxyl, unsaturated alkyl, or unsaturated carboxylic acid radical; and $k+l+m+n \leqq 4$. Examples include vinylsilanes such as $H_2C{=}CHSi(CH_3)_2H$ and $H_2C{=}CHSi(R_{18})_3$ where $R_{18}$ is $CH_3O$, $C_2H_5O$, AcO, $H_2C{=}CH$, or $H_2C{=}C(CH_3)O—$, or vinylphenylmethylsilane; allylsilanes of the formula $H_2C{=}CHCH_2—Si(OC_2H_5)_3$ and $H_2C{=}CHCH_2—Si(H)(OCH_3)_2$; glycidoxypropylsilanes such as (3-glycidoxypropyl) methyldiethoxysilane and (3-glycidoxypropyl) trimethoxysilane; methacryloxypropylsilanes of the formula $H_2C{=}(CH_3)COO(CH_2)_3—Si(OR_{19})_3$ where $R_{19}$ is an alkyl, preferably methyl or ethyl; aminopropylsilane derivatives including $H_2N(CH_2)_3Si(OCH_2CH_3)_3$, $H_2N(CH_2)_3Si(OH)_3$, or $H_2N(CH_2)_3OC(CH_3)_2CH{=}CHSi(OCH_3)_3$. The aforementioned silanes are commercially available from Gelest.

An example of a preferred adhesion promoter having C bonded to O-containing groups is glycidyl ethers including but not limited to 1,1,1-tris-(hydroxyphenyl)ethane tri-glycidyl ether which is commercially available from TriQuest. An example of a preferred adhesion promoter having C bonded to O-containing groups is esters of unsaturated carboxylic acids containing at least one carboxylic acid group. Examples include trifunctional methacrylate ester, trifunctional acrylate ester, trimethylolpropane triacrylate, dipentaerythritol pentaacrylate, and glycidyl methacrylate. The foregoing adhesion promoters are commercially available from Sartomer™.

An example of a preferred adhesion promoter having vinyl groups is vinyl cyclic pyridine oligomers or polymers wherein the cyclic group is pyridine, aromatic, or heteroaromatic. Useful examples include but not limited to 2-vinylpyridine and 4-vinylpyridine, commercially available from Reilly; vinyl aromatics; and vinyl heteroaromatics including but not limited to vinyl quinoline, vinyl carbazole, vinyl imidazole, and vinyl oxazole.

An example of a preferred adhesion promoter having Si-containing groups is the polycarbosilane disclosed in commonly assigned copending allowed U.S. patent application Ser. No. 09/471,299 filed Dec. 23, 1999 incorporated herein by reference in its entirety. The polycarbosilane is that shown in Formula II:

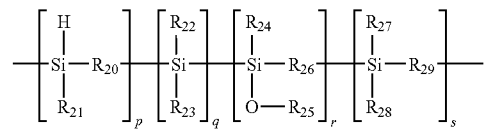

in which $R_{20}$, $R_{26}$, and $R_{29}$ each independently represents substituted or unsubstituted alkylene, cycloalkylene, vinylene, allylene, or arylene; $R_{21}$, $R_{22}$, $R_{23}$, $R_{24}$, $R_{27}$, and $R_{28}$ each independently represents hydrogen atom or organo group comprising alkyl, alkylene, vinyl, cycloalkyl, allyl, or aryl and may be linear or branched; $R_{25}$ represents organosilicon, silanyl, siloxyl, or organo group; and p, q, r, and s satisfy the conditions of $[4 \leqq p+q+r+s \leqq 100{,}000]$, and q and r and s may collectively or independently be zero. The organo groups may contain up to 18 carbon atoms but generally contain from about 1 to about 10 carbon atoms. Useful alkyl groups include $—CH_2—$ and $—(CH_2)_t—$ where $t>1$.

Contemplated polycarbosilanes include dihydridopolycarbosilanes in which $R_{20}$ is a substituted or unsubstituted allylene or phenyl, $R_{21}$ group is a hydrogen atom and there are no appendent radicals in the polycarbosilane chain; that is, q, r, and s are all zero. Another preferred group of polycarbosilanes are those in which the $R_{21}$, $R_{22}$, $R_{23}$, $R_{24}$, $R_{25}$, and $R_{28}$ groups of Formula II are substituted or unsubstituted alkenyl groups having from 2 to 10 carbon atoms. The alkenyl group may be ethenyl, propenyl, allyl, butenyl or any other unsaturated organic backbone radical having up to 10 carbon atoms. The alkenyl group may be dienyl in nature and includes unsaturated alkenyl radicals appended or substituted on an otherwise alkyl or unsaturated organic polymer backbone. Examples of these preferred polycarbosilanes include dihydrido or alkenyl substituted polycarbosilanes such as polydihydridocarbosilane, polyallylhydrididocarbosilane and random copolymers of polydihydridocarbosilane and polyallylhydridocarbosilane.

In the more preferred polycarbosilanes, the $R_{21}$ group of Formula II is a hydrogen atom and $R_{21}$ is methylene and the appendent radicals q, r, and s are zero. Other preferred polycarbosilane compounds of the invention are polycarbosilanes of Formula II in which $R_{21}$ and $R_{27}$ are hydrogen, $R_{20}$ and $R_{29}$ are methylene, and $R_{28}$ is an alkenyl, and appendent radicals q and r are zero. The polycarbosilanes may be prepared from well-known prior art processes or provided by manufacturers of polycarbosilane compositions. In the most preferred polycarbosilanes, the $R_{21}$ group of Formula II is a hydrogen atom; $R_{24}$ is —$CH_2$—; q, r, and s are zero and p is from 5 to 25. These most preferred polycarbosilanes may be obtained from Starfire Systems, Inc. Specific examples of these most preferred polycarbosilanes follow:

| Polycarbosilane | Weight Average Molecular Weight (Mw) | Polydispersity | Peak Molecular Weight (Mp) |
|---|---|---|---|
| 1 | 400-1,400 | 2-2.5 | 330-500 |
| 2 | 330 | 1.14 | 320 |
| 3 (with 10% allyl groups) | 10,000-14,000 | 10.4-16 | 1160 |
| 4 (with 75% allyl groups) | 2,400 | 3.7 | 410 |

As can be observed in Formula II, the polycarbosilanes utilized may contain oxidized radicals in the form of siloxyl groups when r>0. Accordingly, $R_{25}$ represents organosilicon, silanyl, siloxyl, or organo group when r>0. It is to be appreciated that the oxidized versions of the polycarbosilanes (r>0) operate very effectively in, and are well within the purview of the present invention. As is equally apparent, r can be zero independently of p, q, and s the only conditions being that the radicals p, q, r, and s of the Formula II polycarbosilanes must satisfy the conditions of [4<p+q+r+s<100,000], and q and r can collectively or independently be zero.

The polycarbosilane may be produced from starting materials that are presently commercially available from many manufacturers and by using conventional polymerization processes. As an example of synthesis of the polycarbosilanes, the starting materials may be produced from common organo silane compounds or from polysilane as a starting material by heating an admixture of polysilane with polyborosiloxane in an inert atmosphere to thereby produce the corresponding polymer or by heating an admixture of polysilane with a low molecular weight carbosilane in an inert atmosphere to thereby produce the corresponding polymer or by heating an admixture of polysilane with a low molecular carbosilane in an inert atmosphere and in the presence of a catalyst such as polyborodiphenylsiloxane to thereby produce the corresponding polymer. Polycarbosilanes may also be synthesized by the Grignard Reaction reported in U.S. Pat. No. 5,153,295 hereby incorporated by reference in its entirety.

An example of a preferred adhesion promoter having hydroxyl groups is phenol-formaldehyde resins or oligomers of the Formula III: —$[R_{30}C_6H_2(OH)(R_{31})]_u$— where $R_{30}$ is substituted or unsubstituted allylene, cycloallylene, vinyl, allyl, or aryl; $R_{31}$ is alkyl, alkylene, vinylene, cycloalkylene, allylene, or aryl; and u=3-100. Examples of useful alkyl groups include —$CH_2$— and —$(CH_2)_v$— where v>1. A particularly useful phenol-formaldehyde resin oligomer has a molecular weight of 1500 and is commercially available from Schenectady International Inc.

Another suitable adhesion promoter contemplated herein is to utilize an amine salt, such as those already disclosed herein, synthesized using at least one acid with a long tail or bulky group, such as nonafluorobutane-1-sulfonic acid (nfbs) or dodecylbenzenesulfonic acid (dbs) or to utilize an acid bonded to a silane having a reactive functional group, such as acid-TEOS. These contemplated embodiments prevent acid from diffusing from the sacrificial coating material into the absorbing composition/photoresist layered composition to the photoresist. By preventing this diffusion of acid, adhesion is greatly improved between the two layers.

The at least one adhesion promoter may also serve a dual purpose or multi-stage purpose. The adhesion promoter may be specifically chosen for a particular sacrificial coating material or composition based on polarity and/or functional groups other than those characteristics needed by the adhesion promoter in order to promote adhesion in the sacrificial coating material or composition. Once the adhesion promoter is incorporated into the composition it will act effectively as a "magnet" to attract the stripping and/or etching solution to the adhesion promoter by utilizing a difference in polarity between the adhesion promoters or by utilizing the functional groups on the adhesion promoter. This attraction effect by the adhesion promoter can be activated in several ways. For example, there may be an exothermic reaction that takes place when the adhesion promoter is incorporated into the sacrificial coating material or composition at room temperature, there may be an external energy and/or heat that needs to be added to "activate" the adhesion promoter, there may not need to be any energy added to the composition depending on the chemical composition of the adhesion promoter, or there may be a pressure differential applied to the sacrificial coating material or composition that will "activate" the adhesion promoter. However, whether energy is added or not once the adhesion promoter is added, it should be understood that, in this embodiment, the adhesion promoter is not heated or activated to the point where it is chemically modified or broken down until the lithography step is completed.

Solvents

At least one high-boiling solvent and/or at least one replacement solvent may be added to the material, coating and/or film. Without being bound to any particular theory, it is understood that the addition of a high-boiling solvent prevents voiding and improves planarization by making the film a "slow drying" film. As used herein, the phrase "high boiling solvents" means that the solvent volatilizes at a temperature at, near and/or preferably slightly above the drying and/or curing temperature of the material, coating and/or film. Preferred high boiling solvents include glycerol, dibutylether, ethyl lactate dibutylglycerol, dimethyl sulfoxide (DMSO), dimethylformamide (DMF), N-methyl-pyrrolidone (NMP), di-methyl-acetamide (DMAc), high boiling aromatic-based solvents, petroleum ether, the carbitol family, dipropyleneglycol and the glycol ether family. High boiling point solvents can also act as porogens, such as dipropyleneglycol, poly (ethylene) oxide, polypropylene oxide or ethyl lactate.

At least one replacement solvent may also be used to replace any low boiling solvents, such as acetone, in the original coating material in order to improve the planarization of the coating and/or film and decrease voiding. The replacement solvent doesn't necessarily need to be a high-boiling solvent, but must instead improve the planarization ability of the material, coating and/or film over the conventional solvent being used. The replacement solvent may comprise additional functional groups, such as —OH (which can hydrogen bond to the matrix, thus staying within the matrix for a longer period of time) that have been shown to lead to better strip properties at similar bake temperatures for the solvent being replaced. Without being bound to any particular theory, it is understood that the additional functional groups may cause the replacement solvent to act almost like a porogen would to attract the stripping chemistry into the composition. If possible, the low boiling solvents may be left out of the material, coating or film altogether depending on the improvement to the planarization ability of the material, coating and/or film. Typical replacement solvents comprise isopropylalcohol, propanol, butanol, ethanol, PGMEA, ethyl lactate and/or 2-heptanone.

To further describe the above-contemplated embodiment, the solvent may serve a dual purpose or multi-stage purpose. The solvent may be specifically chosen for a particular inorganic composition based on polarity and/or functional groups other than those characteristics needed by the solvent to blend with or solvate the inorganic composition. Once the solvent is incorporated into the composition it will act effectively as a "magnet" to attract the stripping and/or etching solution to the solvent by utilizing a difference in polarity between the solvent or by utilizing the functional groups on the solvent. This attraction effect by the solvent can be activated in several ways. For example, polyethylene oxide is highly soluble in water and the inorganic matrix/composition is not soluble in water. Several of the conventional stripper chemistries are water based and, as such, the presence of the polyethylene oxide draws the stripper deep into the matrix, which greatly increases the film's wet etch rate. This increase in wet etch rate is needed for removal selectivity to be improved for ultra low k dielectric materials and layers.

Typical solvents are also those solvents that are able to solvate the monomers and polymers contemplated herein to be used as inorganic-based compounds and materials. Contemplated solvents include any suitable pure or mixture of organic, organometallic or inorganic molecules that are volatilized at a desired temperature. The solvent may also comprise any suitable pure or mixture of polar and non-polar compounds. In preferred embodiments, the solvent comprises water, ethanol, propanol, acetone, toluene, ethers, cyclohexanone, butyrolactone, methylethylketone, methylisobutylketone, N-methylpyrrolidone, polyethyleneglycolmethylether, mesitylene, ethyl lactate, PGMEA, anisole, and families of poly-ether solvents such as carbitols (which constitute a family of ethyleneglycol ethers capped by hydroxy, alkoxy or carboxy groups) and analogous propyleneglycol ethers.

Catalysts

In other contemplated embodiments, at least one catalyst may be added to the inorganic composition and/or compound in order to improve etch selectivity and/or stripping selectivity through establishing a cross-linked matrix around the pore or pores. Catalysts may also be added in conjunction with the porogen to expedite pore formation. As used herein, the term "catalyst" means any substance that affects the rate of the chemical reaction by lowering the activation energy for the chemical reaction. In some cases, the catalyst will lower the activation energy of a chemical reaction without itself being consumed or undergoing a chemical change. Catalysts may be inorganic, organic, or a complex of organic groups and metal halides. Catalysts may also be liquids, solids, gases or a combination thereof. Contemplated catalysts to add irrespective of the porogen addition may comprise acids, such as HNO3, HCl, lactic acid, acetic acid, oxalic acid, succinic acid, maleic acid and the like. Contemplated porogen depolymerization catalysts that are utilized to expedite pore formation include simple acids as described above, superacid photosensitive molecules such as triarylsulfonium, triaryloxonium, or diaryliodonium salts, free radical generators typically used for vinyl-based, acryl-based (and other multiple-bond monomer-based polymers) polymerization and other free-radical based chemistries (such as benozyl peroxide, azobisisobutyronitrile).

pH Tuning Agent

The pH tuning agent is a compound, material or solution that is added to the sacrificial coating material or composition in order to "tune" or adjust the pH of the final material so that it is compatible or more compatible with any chosen absorbing composition and/or material, including those with absorption peaks around 365 nm, 248 nm, 193 nm and 157 nm. pH tuning agents contemplated herein are those also found in commonly assigned PCT Application Serial No.: PCT/US01/45306 filed on Nov. 15, 2001, which is incorporated by reference in its entirety.

It should be appreciated, however, that the pH tuning agent not only adjusts the pH of the sacrificial material, coating and/or film, but it also influences the chemical performance and characteristics, mechanical performance and structural makeup of the sacrificial material, coating and/or film that is part of the layered material, electronic component or semiconductor component, such that the sacrificial material, coating and/or film is more compatible with the resist material that is coupled to it. More specifically, the pH tuning agent strongly influences the polymeric characteristics, the structural makeup and the spatial orientation that results in optimized film architecture by increasing the surface properties of the sacrificial coating for optimal via fill performance. In other words, a pH tuning agent that merely adjusts the pH of the spin-on material without influencing the mechanical properties and structural makeup of the sacrificial material, coating and/or film or the coupled absorbing composition and/or material is not contemplated herein. Also, it should be understood that several pH tuning agents may also be appropriate as densifying agents, catalysts or both. Each of the material modification agents discussed herein may be classified in more than one category.

Contemplated pH tuning agents must perform two separate and sometimes related functions: a) to influence the pH of the composition to which it is being added; and b) to influence the mechanical performance, chemical properties and/or structural makeup of the inorganic material, coating and/or film, which can also been stated as strongly influencing the polymeric characteristics, the structural makeup and the spatial orientation that results in enhancing the surface properties of the inorganic coating for optimal performance.

Contemplated pH tuning agents are partly designed to influence the pH of the composition or material to which it is added. The class of potential pH tuning agents comprises a)

any suitable acidic or basic solution, compound, and/or component and/or b) any suitable strength or concentration of an acidic or basic solution, compound and/or component. This compilation of suitable pH "influencers" is the larger set of compound from which the ultimate pH tuning agent is chosen, because the pH "influencer" must also be able to influence the mechanical performance and/or structural makeup of the inorganic material, coating and/or film. By this, for example, it is meant that the chosen pH tuning agent is also designed to match the solubility parameter, the molecular weight, the melting point or some other physical characteristic of the sacrificial material. In other words, the pH tuning agent and the inorganic composition and/or coating material cannot be physically incompatible, depending on the desirable physical characteristic, even if the pH tuning agent performs its first function of influencing the pH of the mixture. In preferred embodiments, the desirable physical characteristic is the solubility parameter or the molecular weight. In more preferred embodiments, the desirable physical characteristic is the solubility parameter.

Examples of some suitable pH tuning agents comprise various molar concentrations of the class of amines, such as γ-aminoalkyltrialkoxysilanes, specifically γ-aminopropyltriethoxysilanes (APTEOS); water; oxides and alkoxides, such as sodium alkoxides, potassium alkoxides, potassium hydroxide; hydrogen halides, such as hydrogen bromide, hydrochloric acid; acetic acid; sulfuric acid, lactic acid, nitric acid; TMAH; amine-based oligomers, including those oligomers with inorganic atoms such as silicon, and combinations thereof. Contemplated molar concentrations of the pH tuning agent include pure, 10 Molar, 1.0 Molar, 0.1 Molar and 0.01 Molar concentrations, depending on the pH agent chosen for the resist material.

Additional examples of pH tuning agents include those adhesion promoters discussed above, namely tetramethylammonium acetate (TMAA), tetramethylammonium hydroxide (TMAH), tetrabutylammonium acetate (TBAA), cetyltrimethylammonium acetate (CTAA) and tetramethylammonium nitrate (TMAN).

The pH tuning agent may also serve a dual purpose or multi-stage purpose. The pH tuning agent may be specifically chosen for a particular inorganic compound and/or sacrificial coating material based on polarity and/or functional groups other than those characteristics needed by the pH tuning agent in order to "tune" the inorganic composition. Once the pH tuning agent is incorporated into the composition it will act effectively as a "magnet" to attract the stripping and/or etching solution to the pH tuning agent by utilizing a difference in polarity between the pH tuning agent or by utilizing the functional groups on the pH tuning agent. This attraction effect by the pH tuning agent can be activated in several ways. For example, there may be an exothermic reaction that takes place when the pH tuning agent is incorporated into the inorganic compound or composition and/or sacrificial coating material at room temperature, there may be an external energy and/or heat that needs to be added to "activate" the pH tuning agent, there may not need to be any energy added to the composition depending on the chemical composition of the pH tuning agent, or there may be a pressure differential applied to the inorganic composition that will "activate" the pH tuning agent. However, whether energy is added or not once the pH tuning agent is added, it should be understood that, in this embodiment, the pH tuning agent is not heated or activated to the point where it is chemically modified or broken down until the lithography step is completed.

Densifying Agent

At least one densifying agent may be added to the inorganic compound or composition and/or sacrificial coating material disclosed herein. The densifying agent or compound is similar to those previously mentioned in other material modification sections. It should be understood that many of the compounds mentioned in this and other sections overlap in that some of these compounds may be densifying agents and catalysts or densifying agents and pH tuning agents. For example, catalysts that expedite pore formation can be considered, in some cases, as densifying agents. The densifying agent comprises at least one compound, material or solution that is added to the inorganic compound or composition and/or sacrificial coating material described herein in order to "tune" or adjust the density of the final composition so that the density or other related physical characteristics of the final material are increased relative to the reference material. As used herein, the "reference material" is that material that comprises each component of the contemplated composition described herein except the densifying agent. The "reference material" is meant to be a benchmark composition to which contemplated compositions may be compared.

It should be appreciated, however, that the densifying agent not only adjusts the density of the inorganic compound or composition and/or sacrificial coating material, but it also influences the chemical performance and characteristics, mechanical performance and structural makeup of the final composition that is part of the layered material, electronic component or semiconductor component, such that the final composition is more compatible with the absorbing material, such as an organic film or BARC, that is coupled to it. More specifically, the densifying agent strongly influences the polymeric characteristics, the structural makeup and the spatial orientation that results in increasing the surface properties of the underlying coating, including not only anti-reflective coatings but other layers and layered materials, for optimal resist performance.

Like other material modification agents disclosed herein, contemplated densifying agents must perform two separate and sometimes related functions: a) to influence the physical properties of the composition to which it is being added; and b) to influence the mechanical performance and/or structural makeup of the composition, which can also been stated as strongly influencing the polymeric characteristics, the structural makeup and the spatial orientation that results in increasing the surface properties of the layer, coating and/or material, such as an anti-reflective coating, for optimal resist and/or component performance.

Contemplated densifying agents are partly designed to influence the density of the inorganic compound or composition and/or sacrificial coating material to which it is added. The class of potential densifying agents comprises a) any suitable acidic or basic solution, compound, and/or component and/or b) any suitable strength or concentration of an acidic or basic solution, compound and/or component. This compilation of suitable density "influencers" is the larger set of compounds from which the ultimate densifying agent is chosen, because the density "influencer" must also be able to influence the mechanical performance and/or structural makeup of the final composition while also making the final inorganic compound or composition and/or sacrificial coating material compatible or more compatible. By this, for example, it is meant that the chosen densifying agent is also designed to match the solubility parameter, the molecular weight, the melting point or some other physical characteristic of the inorganic materials, spin-on inorganic materials and/or spin-on-glass materials. In other words, the densifying agent and the inorganic materials, spin-on inorganic materials and/or spin-on-glass materials cannot be physically incompatible, depending on the desirable physical characteristic. In preferred embodiments, the desirable physical characteristic is the solubility parameter or the molecular weight. In more preferred embodiments, the desirable physical characteristic is the solubility parameter.

Examples of some suitable densifying agents or density-tuning agents comprise various molar concentrations of the class of amines, such as γ-aminoalkyltrialkoxysilanes and nitrogen-based salts of those silane compounds, specifically γ-aminopropyltriethoxysilanes (APTEOS) and APTEOS-nitrate ("APTEOS-N"); water; oxides and alkoxides, such as sodium alkoxides, potassium alkoxides, potassium hydroxide; hydrogen halides, such as hydrogen bromide, hydrochloric acid; acetic acid; sulfuric acid, lactic acid, nitric acid; TMAH; acetate-based compounds, such as tetra-methyl ammonium acetate (TMAA), APTEOS-acetate and ammonium acetate; nitrate-based compounds, such as tetra-methyl ammonium nitrate (TMAN—a nitric acid stabilized form of TMAA) and ammonium nitrate; amine-based oligomers, including those oligomers with inorganic atoms such as silicon, and combinations thereof. Contemplated molar concentrations of the densifying agent include pure, 10 Molar, 1.0 Molar, 0.1 Molar and 0.01 Molar concentrations, depending on the densifying agent chosen for the resist material.

Capping Agent

At least one capping agent may also be added to the inorganic composition as a material modification agent. As used herein, the term "capping agent" means a terminating monomer that effectively controls the molecular weight of a particular polymer by "capping" the end of the polymer. In contemplated embodiments, the capping agent comprises a silane monomer with only one reactive group, such as an ethoxy reactive group, with the rest of the monomer being methyl groups. Furthermore, the silane monomer is added late in the parent reaction that forms the inorganic composition. Any suitable terminating monomer may be used in this application, including any silane-based composition, such as an $R_3$-alkoxysilane, where R is a non-reactive group, such as H, $CH_3$ or any organic functionality. The "alkoxy" group may comprise any suitable alkoxy group. In contemplated embodiments, the silane-based composition includes silane compositions such as TMEOS (trimethyl ethoxysilane) or TVEOS (trivinyl ethoxysilane).

Leveling Agent

At least one leveling agent may also be added to the inorganic composition as a material modification agent. As contemplated herein, the at least one leveling agent is added to the inorganic composition to improve the via fill bias in the material. Contemplated leveling agents comprise polyacrylates—both ionic and non-ionic, such as BYK 380 and BYK 381.

The leveling agent may also serve a dual purpose or multi-stage purpose. The leveling agent may be specifically chosen for a particular inorganic composition based on polarity and/or functional groups other than those characteristics needed by the leveling agent in order to help level or planarize all or part of the inorganic composition.

Applications

One method of malting a contemplated composition includes combining at least one inorganic compound or composition, at least one material modification agent, such as a densifying agent, an acid/water mixture, such as a nitric acid/water mixture, and at least one solvent to form a reaction mixture; and refluxing the reaction mixture to form the contemplated composition. The composition formed is then diluted with at least one solvent to provide coating solutions that produce films of various thicknesses. The material modification agent may also and alternatively be added during the refluxing step or after the refluxing step. The material modification agent may also be added during the dilution stage where the thickness of the films is being determined. In other suitable embodiments as mentioned, an incorporatable absorbing compound may be added during the steps used to form the reaction mixture.

In another contemplated method of making a contemplated composition, at least one inorganic compound or composition, at least one material modification agent, and at least one solvent can be combined to form a reaction mixture. The reaction mixture is then refluxed to form the contemplated composition. The composition formed is diluted with at least one solvent to provide coating solutions that produce films of various thicknesses. The material modification agent in this method may either be a variation of the conventional acid/water mixture, in that a different acid may be added, less acid may be added, or more water may be added. The material modification agent may also be added during the dilution step.

More specifically, a reaction mixture including silane reactants, for example HTEOS, or TEOS and MTEOS, or, TMOS and MTMOS; or, alternatively, tetrachlorosilane and methyltrichlorosilane, at least one material modification agent, such as APTEOS-N or APTEOS; a solvent or combination of solvents; and an acid/water mixture, is formed in a reaction vessel. Appropriate solvents include acetone, 2-propanol, and other simple alcohols, ketones and esters such as 1-propanol, MIBK, propoxypropanol, and propyl acetate. The acid/water mixture is, for example nitric acid and water. Other protic acids or acid anhydrides, such as acetic acid, formic acid, phosphoric acid, hydrochloric acid or acetic anhydride are alternatively used in the acid mixture. The resulting mixture is refluxed for between approximately 1 and 24 hours to produce the absorbing composition. As mentioned earlier, the material modification agent may be added during or after the refluxing step, depending on the resist material chosen. Also, as mentioned earlier, the acid concentration and/or strength and the water concentration in the acid/water mixture may be varied in order to become a material modification agent, depending on the inorganic material chosen for the specific layered material, electronic component or semiconductor component application.

The coating solutions are applied to various substrates to form layered materials, layers used in semiconductor processing, or layers used in electronic components, depending on the specific fabrication process, typically by conventional spin-on deposition techniques. These techniques include a dispense spin, a thickness spin, and thermal bake steps, to produce suitable coating. Typical processes include a thickness spin of between 1000 and 4000 rpm for about 20 seconds and two or three bale steps at temperatures between 80° C. and 300° C. for about one minute each. The density-tuned coatings, according to the present invention exhibit refractive indices between about 1.3 and about 2.0. It should also be noted that the density-tuned coatings contemplated herein have increased refractive index measurements relative to their non-density-tuned counterparts.

The coating solutions can also be applied to various substrates to form sacrificial via fill layers, layered materials, layers used in semiconductor processing, or layers used in electronic components, depending on the specific fabrication process, typically by conventional spin-on deposition techniques. These techniques include a dispense spin, a thickness spin, and thermal bake steps, to produce an inorganic coating.

Typical processes include a thickness spin of between 1000 and 4000 rpm for about 20 seconds and one to three bake steps at temperatures between 80° C. and 350° C. for about one minute each.

Substrates contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers such as polyimide. In more preferred embodiments, the substrate comprises a material common in the packaging and circuit board industries such as silicon, copper, glass, and another polymer.

Contemplated coating materials, coating solutions and films can be utilized are useful in the fabrication of a variety of electronic devices, micro-electronic devices, particularly semiconductor integrated circuits and various layered materials for electronic and semiconductor components, including hardmask layers, dielectric layers, metal interconnects (such as copper, aluminum or tungsten interconnects), etch stop layers and buried etch stop layers. These coating materials, coating solutions and films are quite compatible with other materials that might be used for layered materials and devices, such as adamantane-based compounds, diamantane-based compounds, silicon-core compounds, organosiloxane compounds, silicon-based compounds, organic dielectrics, spin-on compositions, metal interconnects (such as copper, aluminum or tungsten interconnects) and nanoporous dielectrics. Compounds that are considerably compatible with the coating materials, coating solutions and films contemplated herein are disclosed in PCT Application PCT/US01/32569 filed Oct. 17, 2001; PCT Application PCT/US01/50812 filed Dec. 31, 2001; U.S. application Ser. No. 09/538,276; U.S. application Ser. No. 09/544,504; U.S. application Ser. No. 09/587,851; U.S. Pat. No. 6,214,746; U.S. Pat. No. 6,171,687; U.S. Pat. No. 6,172,128; U.S. Pat. No. 6,156,812, U.S. Application Ser. No. 60/350,187 filed Jan. 15, 2002; and U.S. 60/347,195 filed Jan. 8, 2002, which are all incorporated herein by reference in their entirety.

Coating materials contemplated herein may also be coupled to anti-reflective coating materials that are designed to a) absorb strongly and uniformly in the ultraviolet spectral region; b) keep the resist material from "falling over" and expanding outside or contracting inside of the intended resist line and/or c) be impervious to photoresist developers and methods of production of spin-on glass anti-reflective coatings. Baldwin et al. have developed several of these contemplated anti-reflective coatings that are superior to conventional anti-reflective coatings, including those materials and coatings found in U.S. Pat. No. 6,268,457 issued on Jul. 31, 2001; U.S. Pat. No. 6,365,765 issued on Apr. 2, 2002; U.S. Pat. No. 6,368,400 issued on Apr. 9, 2002; U.S. patent application Ser. No. 09/491,166 filed Jan. 26, 2000; Ser. No. 10/012,651 filed Nov. 5, 2001; Ser. No. 10/012,649 filed Nov. 5, 2001; Ser. No. 10/001,143 filed Nov. 15, 2001; PCT Applications Serial Nos: PCT/US00/15772 filed on Jun. 8, 2000; WO 02/06402 filed on Jul. 12, 2001; PCT/US01/45306 filed on Nov. 15, 2001; Pending PCT Application filed on Oct. 31, 2002 (Serial No. not yet assigned); Pending PCT Application PCT/US02/36327 filed on Nov. 12, 2002; European Patent Applications Serial No. 00941275.0 filed on Jun. 6, 2000; and 01958953.0 filed on Jul. 17, 2001, which are all commonly assigned and incorporated herein by reference in their entirety. However, with all of these materials, it would be beneficial to be able to modify the materials, coatings and films described therein to improve etch selectivity and/or stripping selectivity and to minimize fill bias. As used herein, the term "fill bias" means the difference in fill and fill planarization between dense and sparse topography, such as via or line structures.

The compounds, coatings, films, materials and the like described herein may be used to become a part of, form part of or form an electronic component and/or semiconductor component. As used herein, the term "electronic component" also means any device or part that can be used in a circuit to obtain some desired electrical action. Electronic components contemplated herein may be classified in many different ways, including classification into active components and passive components. Active components are electronic components capable of some dynamic function, such as amplification, oscillation, or signal control, which usually requires a power source for its operation. Examples are bipolar transistors, field-effect transistors, and integrated circuits. Passive components are electronic components that are static in operation, i.e., are ordinarily incapable of amplification or oscillation, and usually require no power for their characteristic operation. Examples are conventional resistors, capacitors, inductors, diodes, rectifiers and fuses.

Electronic components contemplated herein may also be classified as conductors, semiconductors, or insulators. Here, conductors are components that allow charge carriers (such as electrons) to move with ease among atoms as in an electric current. Examples of conductor components are circuit traces and vias comprising metals. Insulators are components where the function is substantially related to the ability of a material to be extremely resistant to conduction of current, such as a material employed to electrically separate other components, while semiconductors are components having a function that is substantially related to the ability of a material to conduct current with a natural resistivity between conductors and insulators. Examples of semiconductor components are transistors, diodes, some lasers, rectifiers, thyristors and photosensors.

Electronic components contemplated herein may also be classified as power sources or power consumers. Power source components are typically used to power other components, and include batteries, capacitors, coils, and fuel cells. Power consuming components include resistors, transistors, integrated circuits (ICs), sensors, and the like.

Still further, electronic components contemplated herein may also be classified as discreet or integrated. Discreet components are devices that offer one particular electrical property concentrated at one place in a circuit. Examples are resistors, capacitors, diodes, and transistors. Integrated components are combinations of components that that can provide multiple electrical properties at one place in a circuit. Examples are integrated circuits in which multiple components and connecting traces are combined to perform multiple or complex functions such as logic.

EXAMPLES

Analytical Test Methods:

Refractive Index The refractive index (n) measurements are performed together with the thickness measurements using a n&k Analyzer spectrophotometer.

Molecular Weight The molecular weight (Mw) measurements are performed by using Gas Phase Chromatography.

% Via Fill: The % Via Fill measurements are performed using a via-fill wafer along with a Scanning Electron Microscope.

Wet Strip Rate (in BOE, TMAH, NE-89 (partially aqueous F-based etchants, such as this one by Air Products) or other wet chemicals): The wafer is dip-coated with film into the contemplated wet chemicals at various temperature, e.g., room temperature, 50° C., 75° C., etc for various period of time, e.g., 15 sec., 30 sec., 1 min, 2 min, 5 min, or 10 min. Measure the film thickness before dipping and after dipping. Wet strip rate is calculated by the film thickness change per unit time.

Isothermal Gravimetric Analysis (ITGA) Weight Loss: Total weight loss was determined on the TA Instruments 2950 Thermogravimetric Analyzer (TGA) used in conjunction with a TA Instruments thermal analysis controller and associated software. A Platinel II Thermocouple and a Standard Furnace with a temperature range of about 25° C. to about 1000° C. and heating rate of about 0.1° C. to about 100° C./min were used. A small amount of sample (about 7 to about 12 mg) was weighed on the TGA's balance (resolution: about 0.1 g; accuracy: to + about 0.1%) and heated on a platinum pan. Samples were heated under nitrogen with a purge rate of about 100 ml/min (about 60 ml/min going to the furnace and about 40 ml/min to the balance). Sample was equilibrated under nitrogen at about 20° C. for about 20 minutes, then the temperature was raised to about 130° C. at a rate of about 10° C./minute and held at about 130° C. for about 1 minute. Temperature was then ramped to about 250° C. at a rate of about 10° C./minute and held at about 250° C. for about 3 minutes. The weight loss at about 250° C. for the about 90 seconds period was calculated.

FTIR analysis: FTIR spectra were taken using a Nicolet Magna 550 FTIR spectrometer in transmission mode. Substrate background spectra were taken on uncoated substrates. Film spectra were taken using the substrate as background. Film spectra were then analyzed for change in peak location and intensity. Methods for measuring FTIR of any of the contemplated compositions or solutions may be fund in commonly-assigned US Patent Application Serial No.: US 20030151031 filed on Aug. 14, 2003, which is incorporated herein in its entirety.

Contact angle: Methods for measuring contact angle of any of the contemplated compositions or solutions may be found in commonly-assigned PCT Application Serial No.: PCT/US02/36327, which is incorporated herein in its entirety.

pH measurement: Methods for measuring pH of any of the contemplated compositions or solutions may be found in commonly-assigned PCT Application Serial No.: PCT/US01/45306, which is incorporated herein in its entirety.

Some of the methods of synthesizing the materials comprising at least one inorganic-based material or composition and at least one material modification agent that includes at least one porogen, at least one high-boiling solvent, at least one capping agent, at least one leveling agent, at least one catalyst, at least one replacement solvent, at least one pH tuning agent, and/or a combination thereof in order to increase etch selectivity and/or stripping selectivity and increase planarizationability, while decreasing voiding are illustrated in the following examples.

To a Si—O based organosiloxane solution, we add polyethylene oxide porogen (in the study conducted a range of about 0.05 to about 6% of polyethylene oxide was studied). The films are cast onto wafers containing vias (via first copper dual damascene pattern), and then baked to a temperature between about 200 and 260° C. Data shows that the transparent composition film (whether porous or not) is resistant to PGMEA at this bake temperature. It is also at a temperature just above the bake temperature required by the BARC process (anywhere between 170 and 240° C.). Next an organic absorbing composition/anti-reflective film is coated and baked on top of the Si—O layer, since the Si—O layer does not comprise a chromophore. Because at least the majority of the topography is filled with a Si—O-based layer, a thinner organic absorbing layer may be utilized. A thinner organic absorbing composition/anti-reflective layer facilitates the pattern transfer of photoresist through and into the Si—O and ultra-low k layer. Since the Si—O fill material is transparent, the thickness of the organic absorbing material (anti-reflective layer) should be equal to the first or second reflectance minimum or at a thickness where the reflectance is independent of the thickness—an absorption regime. Also, since the Si—O layer is now weak, it can be coated to sufficient thickness to improve planarization. If, however, the weak SiO layer does absorb at the wavelength of the photoresist, the organic absorbing composition/anti-reflective layer can be made sufficiently thin to act simply as a cap to the weak Si—O film. Making the organic absorbing composition/anti-reflective layer so thin further improves the ability to accurately transfer through the use of plasma etch the imaged pattern in the resist into the dielectric below.

Photoresist is then deposited and patterned. The pattern is then etched through the organic absorbing composition/anti-reflective layer, through the weak Si—O layer and into the ultra-low k layer. Once the etch is complete the remaining photoresist and organic absorbing composition/anti-reflective layer are removed (if present), followed by the removal of the remaining weak Si—O layer. Now the trench-via pattern is defined and ready for metalization.

In summary, the weak inorganic-based porous film is baked to a temperature that is too low to drive out the porogen and/or high boiling solvent. The porogen conduits are left behind within the Si—O anti-reflective coating film that when exposed to 2.3% TMAH or other aqueous-based amine or fluorine chemistries are completely removed. However, when exposed to PGMEA—a typical casting solvent of organic BARCs or ARCs—no etching of the inorganic-based film occurs.

The following examples show several wet etch studies performed using the materials described herein:

| Metrics | | Descriptions | | | |
|---|---|---|---|---|---|
| | | 1% PEO, no PTEOS ER (A/min) | 2% PEO, no PTEOS ER (A/min) | 3% PEO, no PTEOS ER (A/min) | 4% PEO, no PTEOS ER (A/min) |
| 2.5% TMAH @ | 1 min | 80 | 82 | 122 | 151 |

-continued

| Metrics | | Descriptions | | | |
|---|---|---|---|---|---|
| | | 1% PEO, no PTEOS ER (A/min) | 2% PEO, no PTEOS ER (A/min) | 3% PEO, no PTEOS ER (A/min) | 4% PEO, no PTEOS ER (A/min) |
| 21° C. | | | | | |
| PGMEA @ | 6 min | 5.5 | 3 | 4.3 | 3.3 |
| 21° C. | | | | | |
| NE-89@ | 30 sec | 2335 | 1369 (*) | 1749 (*) | >2909 |
| 21° C. | 15 sec | 2088 | 2386 | 3529 | 3825 |

The parent lot for this set of Examples comprises about 297 grams ethanol, about 148.56 grams of PGMEA, about 123.56 grams of TEOS, about 76.94 grams of MTEOS, about 5.599 grams of 0.1 N $HNO_3$, about 66.86 grams of $H_2O$ and about 43.77 grams of butanol. There is no phenyl-TEOS (PTEOS) or other chromaphore in the parent lot—and therefore, the coating is transparent from a wavelength of 193 nm to about 365 nm. The parent lot cooked at about 60° C. for about 4 hours and then was cooled to room temperature.

Once the parent lot was prepared, it could be modified in several ways, such as by taking about 150 grams of the parent lot and adding about 1.5 grams of polyethylene oxide ("PEO") to form a first derivative lot. The first derivative lot could be further modified by taking about 71 grams of the first derivative lot and adding about 53 grams of PGMEA (1% PEO, no PTEOS shown above). In these examples, the % PEO refers to the dilution ratio with respect to the parent lot, not the percentage to final diluted product.

The parent lot could be modified further by adding about 3 grams of PEO, about 4.6 grams of PEO or about 6.25 grams of PEO. Each of these derivative lots could be further modified, similar to the first derivative lot, by taking about 75 grams of each of the derivative lots and adding about 56.1375 grams PGMEA (2% PEO, no PTEOS shown above), 56.3625 grams PGMEA (3% PEO, no PTEOS shown above) or 57.27 grams PGMEA (4% PEO, no PTEOS shown above) respectively.

Thus, specific embodiments and applications of compositions and methods to produce inorganic-based materials, spin-on materials, spin-on inorganic materials and spin-on glass materials comprising at least one material modification agent, such as at least one porogen, at least one high-boiling solvent, at least one catalyst, at least one replacement solvent, at least one capping agent, at least one leveling agent, at least one pH tuning agent, and/or a combination thereof have been disclosed. It should be apparent, however, to those skilled in the art that many more modifications besides those already described are possible without departing from the inventive concepts herein. The inventive subject matter, therefore, is not to be restricted except in the spirit of the disclosure presented herein. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A sacrificial coating material comprising:

at least one inorganic compound, and at least one material modification agent, wherein the sacrificial coating material is transparent from a wavelength of 193 nm to about 365 nm and dissolvable in an alkaline-based chemistry or a fluorine-based chemistry.

2. The sacrificial coating material of claim 1, wherein the inorganic compound comprises a silicon-based compound.

3. The sacrificial coating material of claim 2, wherein the silicon-based compound comprises at least one siloxane compound, at least one silazane polymer, dimethylsiloxane, diphenylsiloxane, methylphenylsiloxane, at least one silicate polymer, at least one silsilic acid derivative, and mixtures thereof.

4. The sacrificial coating material of claim 3, wherein the at least one siloxane compound comprises methylsiloxane, methylsilsesquioxane, phenylsiloxane, phenylsilsesquioxane, methylphenylsiloxane, methylphenylsilsesquioxane or combinations thereof.

5. The sacrificial coating material of claim 2, wherein the at least one silicon-based compound comprises at least one hydrogensiloxane polymer having the general formula $(H_{0-1.0}SiO_{1.5-2.0})_x$, at least one hydrogensilsesquioxane polymer having the formula $(HSiO_{1.5})_x$, where x is greater than about four and derivatives of silsilic acid or a combination thereof.

6. The sacrificial coating material of claim 2, wherein the at least one silicon-based compound comprises copolymers of hydrogensilsesquioxane and an alkoxyhydridosiloxane or hydroxyhydridosiloxane.

7. The sacrificial coating material of claim 2, wherein the silicon-based compound comprises acrylic siloxane polymers, silsesquioxane-based polymers, derivatives of silici acid, organohydridosiloxane polymers of the general formula $(H_{0-1.0}SiO_{1.5-2.0})_n(R_{0-1.0}SiO_{1.5-2.0})_m$, organohydridosilsesquioxane polymers of the general formula $(HSiO_{1.5})_n(RSiO_{1.5})_m$, where m is greater than zero and the sum of n and m is greater than about four and R is alkyl or aryl, and combinations thereof.

8. The sacrificial coating material of claim 7, wherein the organohydridosiloxane polymer comprises methylhydridosiloxanes, ethylhydridosiloxanes, propylhydridosiloxanes, t-butylhydridosiloxanes, phenylhydridosiloxanes and combinations thereof.

9. The sacrificial coating material of claim 7, wherein the silsesquioxane-based polymer comprises methylhydridosilsesquioxanes, ethylhydridosilsesquioxanes, propylhydridosilsesquioxanes, t-butylhydridosilsequioxanes, phenylhydridosilsesquioxanes, and combinations thereof.

10. The sacrificial coating material of claim 1, wherein the at least one material modification agent comprises at least one porogen, at least one adhesion promoter, at least one densifying agent, at least one leveling agent, at least one high-boiling solvent, at least one catalyst, at least one pH tuning agent, at least one capping agent or at least one replacement solvent.

11. The sacrificial coating material of claim 1, wherein the alkaline-based chemistry comprises an amine-based compound.

12. The sacrificial coating material of claim 11, wherein the amine-based compound comprises a primary amine, a secondary amine, a tertiary amine or a combination thereof.

13. The sacrificial coating material of claim 12, wherein the amine-based compound comprises TMAH.

14. A transparent via fill coating layer comprising the material of claim 1.

15. The transparent via fill coating layer of claim 14, wherein the layer is sacrificial.

16. A layered material, comprising:

the via fill coating layer of claim 14, an absorbing composition layer, and a photoresist layer.

17. The layered material of claim 16, wherein the layered material is coupled to a dielectric layer.

18. A method of producing a sacrificial coating material, comprising:

providing at least one inorganic compound, providing at least one material modification agent, combining the at least one inorganic compound with the at least one material modification agent to form the sacrificial coating material, wherein the sacrificial coating material is transparent from a wavelength of 193 nm to about 365 nm and dissolvable in an alkaline-based chemistry or a fluorine-based chemistry.

19. The method of claim 18, wherein the inorganic compound comprises a silicon-based compound.

20. The method of claim 19, wherein the silicon-based compound comprises at least diphenylsiloxane, methylphenylsiloxane, at least one silicate polymer, at least one silsilic acid derivative, and mixtures thereof.

21. The method of claim 20, wherein the at least one siloxane compound comprises methylsiloxane, methylsilsesquioxane, phenylsiloxane, phenylsilsesquioxane, methylphenylsiloxane, methylphenylsilsesquioxane or combinations thereof.

22. The method of claim 19, wherein the at least one silicon-based compound comprises at least one hydrogensiloxane polymer having the general formula $(H_{0-1.0}SiO_{1.5-2.0})_x$, at least one hydrogensilsesquioxane polymer having the formula $(HSiO_{1.5})_x$, where x is greater than about four and derivatives of silsilic acid or a combination thereof.

23. The method of claim 19, wherein the at least one silicon-based compound comprises copolymers of hydrogensilsesquioxane and an alkoxyhydridosiloxane or hydroxyhydridosiloxane.

24. The method of claim 19, wherein the silicon-based compound comprises acrylic siloxane polymers, silsesquioxane-based polymers, derivatives of silici acid, organohydridosiloxane polymers of the general formula $(H_{0-1.0}SiO_{1.5-2.0})_n(R_{0-1.0}SiO_{1.5-2.0})_m$, organohydridosilsesquioxane polymers of the general formula $(HSiO_{1.5})_n(RSiO_{1.5})_m$, where m is greater than zero and the sum of n and m is greater than about four and R is alkyl or aryl, and combinations thereof.

25. The method of claim 24, wherein the organohydridosiloxane polymer comprises methylhydridosiloxanes, ethylhydridosiloxanes, propylhydridosiloxanes, t-butylhydridosiloxanes, phenylhydridosiloxanes and combinations thereof.

26. The method of claim 24, wherein the silsesquioxane-based polymer comprises methylhydridosilsesquioxanes, ethylhydridosilsesquioxanes, propylhydridosilsesquioxanes, t-butylhydridosilsequioxanes, phenylhydridosilsesquioxanes, and combinations thereof.

27. The method of claim 18, wherein the at least one material modification agent comprises at least one porogen, at least one adhesion promoter, at least one densifying agent, at least one leveling agent, at least one high-boiling solvent, at least one catalyst, at least one pH tuning agent, at least one capping agent or at least one replacement solvent.

28. The method of claim 18, wherein the alkaline-based chemistry comprises an amine-based compound.

29. The method of claim 28, wherein the amine-based compound comprises a primary amine, a secondary amine, a tertiary amine or a combination thereof.

30. The method of claim 29, wherein the amine-based compound comprises TMAH.

31. A transparent via fill coating layer formed using the method of claim 18.

32. The transparent via fill coating layer of claim 30, wherein the layer is sacrificial.

* * * * *